(12) United States Patent
Tinker

(10) Patent No.: US 9,940,303 B2
(45) Date of Patent: Apr. 10, 2018

(54) METHOD AND APPARATUS FOR DECIMATION IN FREQUENCY FFT BUTTERFLY

(71) Applicant: Tempo Semiconductor, Inc., Austin, TX (US)

(72) Inventor: Darrell Eugene Tinker, Austin, TX (US)

(73) Assignee: Tempo Semiconductor, Inc., Austin, TX (US)

( * ) Notice: Subject to any disclaimer, the term of this patent is extended or adjusted under 35 U.S.C. 154(b) by 0 days.

(21) Appl. No.: 15/060,475

(22) Filed: Mar. 3, 2016

(65) Prior Publication Data

US 2017/0011005 A1    Jan. 12, 2017

Related U.S. Application Data

(60) Provisional application No. 62/190,858, filed on Jul. 10, 2015.

(51) Int. Cl.
*G06F 17/14* (2006.01)

(52) U.S. Cl.
CPC .................................. *G06F 17/142* (2013.01)

(58) Field of Classification Search
None
See application file for complete search history.

(56) References Cited

U.S. PATENT DOCUMENTS

| | | | | |
|---|---|---|---|---|
| 2006/0095492 A1* | 5/2006 | Brown | ................. | G06F 17/142 708/404 |
| 2006/0248135 A1* | 11/2006 | Cousineau | ............ | G06F 17/142 708/404 |
| 2007/0239815 A1* | 10/2007 | Cousineau | ............ | G06F 17/142 708/404 |
| 2009/0106341 A1* | 4/2009 | Al Adnani | ............ | G06F 17/142 708/404 |
| 2017/0011005 A1* | 1/2017 | Tinker | ................. | G06F 17/142 |

* cited by examiner

*Primary Examiner* — David H Malzahn
(74) *Attorney, Agent, or Firm* — Hunt Pennington Kumar & Dula, PLLC; Artie Pennington; Jeffrey Van Myers

(57) ABSTRACT

A pipelined decimation in frequency FFT butterfly method, and an apparatus to perform this method comprising: a data memory with at least one read port and one write port; an add/subtract unit receiving data from the memory; a multiply/accumulate unit receiving data from the add/subtract unit; a source of coefficients, from logic gates or a coefficient memory, to supply FFT twiddle factors to the multiply/accumulate unit; a shifter receiving data from at least one of the add/subtract unit and the multiply/accumulate unit, the shifter supplying data to the write port of the data memory; wherein the apparatus performs these calculations in four cycles of the add/subtract unit and in four cycles of the multiply/accumulate unit, using complex arithmetic.

5 Claims, 2 Drawing Sheets

METHOD AND APPARATUS FOR DECIMATION IN FREQUENCY FFT BUTTERFLY

CROSS REFERENCE TO RELATED APPLICATIONS

This application is related to the following:
1. Provisional Application Ser. No. 62/190,858, filed 10 Jul. 2015 ("Parent Provisional"); and
2. application Ser. No. 14/961,861, filed 7 Dec. 2015 ("Related Application").

This application claims priority to the Parent Provisional, and hereby claims benefit of the filing date thereof pursuant to 37 CFR § 1.78(a)(4).

The subject matter of the Parent Provisional and the Related Application, each in its entirety, is expressly incorporated herein by reference.

BACKGROUND OF THE INVENTION

1. Field of the Invention

The present invention relates to a Fast Fourier Transform ("FFT") processor for use with digital-to-analog conversion circuits and the like.

2. Description of the Related Art

In general, in the descriptions that follow, I will italicize the first occurrence of each special term of art that should be familiar to those skilled in the art of integrated circuits ("ICs") and systems. In addition, when I first introduce a term that I believe to be new or that I will use in a context that I believe to be new, I will bold the term and provide the definition that I intend to apply to that term. In addition, throughout this description, I will sometimes use the terms assert and negate when referring to the rendering of a signal, signal flag, status bit, or similar apparatus into its logically true or logically false state, respectively, and the term toggle to indicate the logical inversion of a signal from one logical state to the other. Alternatively, I may refer to the mutually exclusive boolean states as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

Hereinafter, when I refer to a facility I mean a circuit or an associated set of circuits adapted to perform a particular function regardless of the physical layout of an embodiment thereof. Thus, the electronic elements comprising a given facility may be instantiated in the form of a hard macro adapted to be placed as a physically contiguous module, or in the form of a soft macro the elements of which may be distributed in any appropriate way that meets speed path requirements. In general, electronic systems comprise many different types of facilities, each adapted to perform specific functions in accordance with the intended capabilities of each system. Depending on the intended system application, the several facilities comprising the hardware platform may be integrated onto a single IC, or distributed across multiple ICs. Depending on cost and other known considerations, the electronic components, including the facility-instantiating IC(s), may be embodied in one or more single- or multi-chip packages. However, unless I expressly state to the contrary, I consider the form of instantiation of any facility that practices my invention as being purely a matter of design choice.

Shown in FIG. 1 is a typical general purpose computer system 10. In particular, in recently-developed battery-powered mobile systems, such as smart-phones and the like, many of the discrete components typical of desktop or laptop devices illustrated in FIG. 1 are integrated into a single integrated circuit chip.

Shown by way of example in FIG. 2 is one embodiment of a single-chip audio coder/decoder ("CODEC") 12 comprising: a plurality of digital modules; and a plurality of analog modules. In this embodiment, CODEC 12 includes a Serial Data Interface facility adapted to send data to, and receive digital data from, the system 10; a Digital Phase-Locked Loop ("DPLL") facility adapted to determine the timing and rate relationship between two asynchronous data streams; a Configuration Memory and Control facility adapted to control which facilities are used and how, in accordance with configuration and control information received from the system 10; a Digital Signal Processor ("DSP") facility adapted to perform various data processing activities in accordance with a stored computer program; and a Data Memory facility adapted to store, as required, audio data flowing from the system 10 to the audio output devices. I may expand on the functionality of certain of these facilities as I now explain the method of operation of my invention and embodiments thereof.

A Fast Fourier Transform is an algorithm used in many DSP applications to transform time domain data to frequency domain data, and vice versa. For example, in a CODEC, an FFT may be used to implement adaptive frequency domain filtering, such as for echo cancellation or noise cancellation. An FFT is calculated by performing multiple iterations of butterfly operations, each of which combines two or more complex data samples to produce the same number of transformed complex data samples, using complex add, subtract, and multiply operations.

Various apparatus and methods have been used to implement Fast Fourier Transform ("FFT") butterfly operations. A radix-two FFT butterfly operation combines two complex data samples to produce two transformed complex data samples. The complex data samples can each be divided into a real part and an imaginary part, each part of which can be represented by a single data word. The memory bandwidth must be capable of both reading and writing four data words for each butterfly operation. Also four multiply or multiply/accumulate ("MAC") operations are required, and four other add or subtract operations. This combination of fours suggests that an efficient FFT implementation with a single MAC unit will complete a butterfly every four cycles, and will require at least one add/subtract unit ("ASU"), and memory allowing at least four read and four write cycles for each butterfly. In the prior art, this memory bandwidth has been achieved by various methods, such as a memory width of two words, a multi-port memory, a double clocked memory, or two parallel data memories, for example with one memory for the real data and one for the imaginary data.

Two known butterfly operations are the radix-two decimation in time ("DIT") and radix-two decimation in frequency ("DIF") butterflies. The radix-two DIT butterfly is:

$$Y0 = X0 + (W*X1) \quad \text{[Eq. 1]}$$

$$Y1 = X0 - (W*X1) \quad \text{[Eq. 2]}$$

And the radix-two DIF butterfly is:

$$X0 = \frac{1}{2}*(Y0 + Y1) \quad \text{[Eq. 3]}$$

$$X1 = \frac{1}{2} * W * (Y0 - Y1) \qquad \text{[Eq. 4]}$$

In each of the above equations, the W, X, and Y values are complex numbers. As is known, each complex addition requires two additions, and each complex multiplication requires four multiplications and two additions or subtractions. In one embodiment, the additions and subtractions that are part of the complex multiplication can be merged with the multiplications in a MAC operation. As is known, DIT performs the complex multiplication before the complex additions and subtractions, whereas DIF performs the complex additions and subtractions first.

Some prior art has supported a pipelined butterfly implementation, completing one butterfly every 4 pipeline cycles, except for some overhead to initialize pointers and counters or change twiddle factors. Other prior art has had other logic or memory to supply the twiddle factors without requiring data memory accesses for them. While much of the prior art is focused on DIT butterfly implementations, the DIF butterfly lends itself better to an implementation that allows the datapath to also efficiently implement other DSP algorithms that involve an addition before a multiplication, such as linear phase FIR filters.

What is needed is a DIF butterfly that is more efficient and effective than the known art.

BRIEF SUMMARY OF THE INVENTION

In accordance with my invention, I provide a decimation in frequency FFT butterfly processor comprising: a data memory; six data registers; two accumulator registers; a multiplier-accumulator unit; and a multiplexer. In particular, the data memory has at least one read port and at least one write port, and is adapted to store a write data. The first register is operably coupled to the read port, and is adapted to store first data received from the read port. The second register is operably coupled to the read port, adapted to store second data received from the read port. The third register is operably coupled to the first register, and is adapted to store a fourth data comprising a selected one of the first data and inverted first data received from the first register. The adder is operably coupled to the second and third registers, and is adapted to add the second data and the fourth data to produce a fifth data comprising a selected one of a sum and a difference. The fourth register is operably coupled to the adder, and is adapted to store the fifth data received from the adder. The fifth register is operably coupled to a coefficient source, and is adapted to store a coefficient received from a coefficient source. The multiplier/accumulator unit is operably coupled to the fourth and fifth registers and to the first and second accumulator registers, and is adapted to: produce a product of the fifth data received from the fourth register and the coefficient received from the fifth register; add the product and a sum stored in a selected one of the first and the second accumulator register; and store the sum in a selected one of the first and second accumulator registers. The sixth register is operably coupled to the adder, and is adapted to store a sixth data comprising a selected one of the sum and difference received from the adder. The multiplexer is operably coupled to the sixth register, the first and second accumulator registers and to the write port of the data memory, and is adapted to select as the write data a selected one of the sixth data stored in the sixth register and the sum stored in a selected one of the first or second accumulator registers, and to provide the selected write data to the write port of the data memory. In accordance with one embodiment of my DIF butterfly processor, the several elements can be adapted to operate to great advantage in a pipelined fashion.

In accordance with another embodiment of my invention, I provide a method for use in an audio CODEC, the method adapted to calculate a decimation in frequency butterfly operation. In particular, during a first phase of operation, I read two imaginary data values and two real data values from a data memory. During a second phase of operation, I calculate, in a selected order: a first difference of the second imaginary data value minus the first imaginary data value; a first sum of the first and second imaginary data values; a second difference of the second real data value minus the first real data value; and a second sum of the first and second real data values. During a third phase of operation, I calculate, in a selected order: a first product of the first difference and a real twiddle factor; a second product of the negative of the first difference and an imaginary twiddle factor; a third product of the second difference and the imaginary twiddle factor; a fourth product of the second difference and the real twiddle factor; a first accumulation of the first product with the third product; and a second accumulation of the second product with the fourth product. During a fourth phase of operation, I transform, in a selected order: the first sum by a first predetermined factor; the first accumulation by a second predetermined factor; the second sum by a third predetermined factor; and the second accumulation by a fourth predetermined factor. During a fifth phase of operation, I write in the data memory: the transformed first sum; the transformed first accumulation; the transformed second sum; and the transformed second accumulation. In accordance with one embodiment of this method, the several phases of operation can be performed to great advantage in a pipelined fashion. In particular, in such an embodiment, the reads from memory during the first phase and the writes to memory during the fifth phase may be ordered with respect to each other such that writes to real data are performed in parallel with reads from imaginary data, and the writes to imaginary data may be performed in parallel with reads from real data.

In accordance with yet another embodiment of my invention, I provide a method for use in an audio CODEC, the method adapted to calculate a decimation in frequency butterfly operation. In particular, during a first phase of operation, I read from a data memory, in a selected order: a first real data value; a second real data value; a first imaginary data value; and a second imaginary data value. During a second phase of operation, I calculate, in a selected order: a first difference of the second real data value minus the first real data value; a first sum of the first and second real data values; a second difference of the second imaginary data value minus the first imaginary value; and a second sum of the first and second imaginary data values. During a third phase of operation, I calculate in a carry-save form, in a selected order: a first carry-save product of the first difference and an imaginary twiddle factor; a second carry-save product of the first difference and a real twiddle factor; a third carry-save product of the second difference and the real twiddle factor; a fourth carry-save product of the negative of the second difference and the imaginary twiddle factor; a first carry-save accumulation of the first carry-save product with the third carry-save product; and a second carry-save accumulation of the second carry-save product with the fourth carry-save product. During a fourth phase of operation, I calculate, in a selected order: nothing; nothing; a first carry-propagate accumulation from the first carry-save accumulation; a second carry-propagate accumulation from the second carry-save accumulation. During a fifth phase of operation, I transform, in a selected order: the first sum by a first predetermined factor; the second sum by a second predetermined factor; the first carry-propagate accumulation by a third predetermined factor; and the second carry-propagate accumulation by a fourth predetermined factor. During a sixth phase of operation, I write in the data memory, in a selected order: the transformed first sum; the transformed second sum; the transformed first carry-propagate accumulation; and the transformed second carry-propagate accumulation. In accordance with one embodiment of this method, the several phases of operation can be performed to great advantage in a pipelined fashion. In particular, in such an embodiment, the reads from memory during the first phase and the writes to memory during the sixth phase may be ordered with respect to each other such that writes to real data are performed in parallel with reads from imaginary data, and writes to imaginary data may be performed in parallel with reads from real data.

In accordance with another embodiment of my invention, an audio CODEC may be configured to practice my DIF butterfly methods.

In accordance with yet another embodiment of my invention, an electronic system comprising a CODEC may be configured to practice my DIF butterfly methods.

In accordance with still another embodiment of my invention, a computer readable medium may include executable instructions which, when executed in a processing system, causes the processing system to perform the steps of my DIF butterfly methods.

BRIEF DESCRIPTION OF THE SEVERAL VIEWS OF THE DRAWINGS

My invention may be more fully understood by a description of certain preferred embodiments in conjunction with the attached drawings in which.

Figure 1:
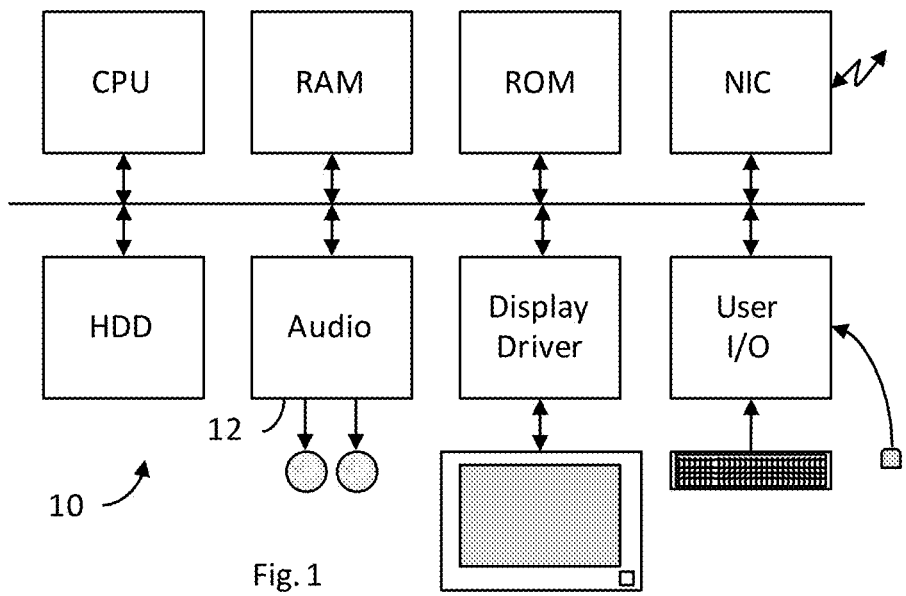
FIG. 1 illustrates, in block diagram form, a general purpose computer system adapted to practice my invention.
Figure 2:
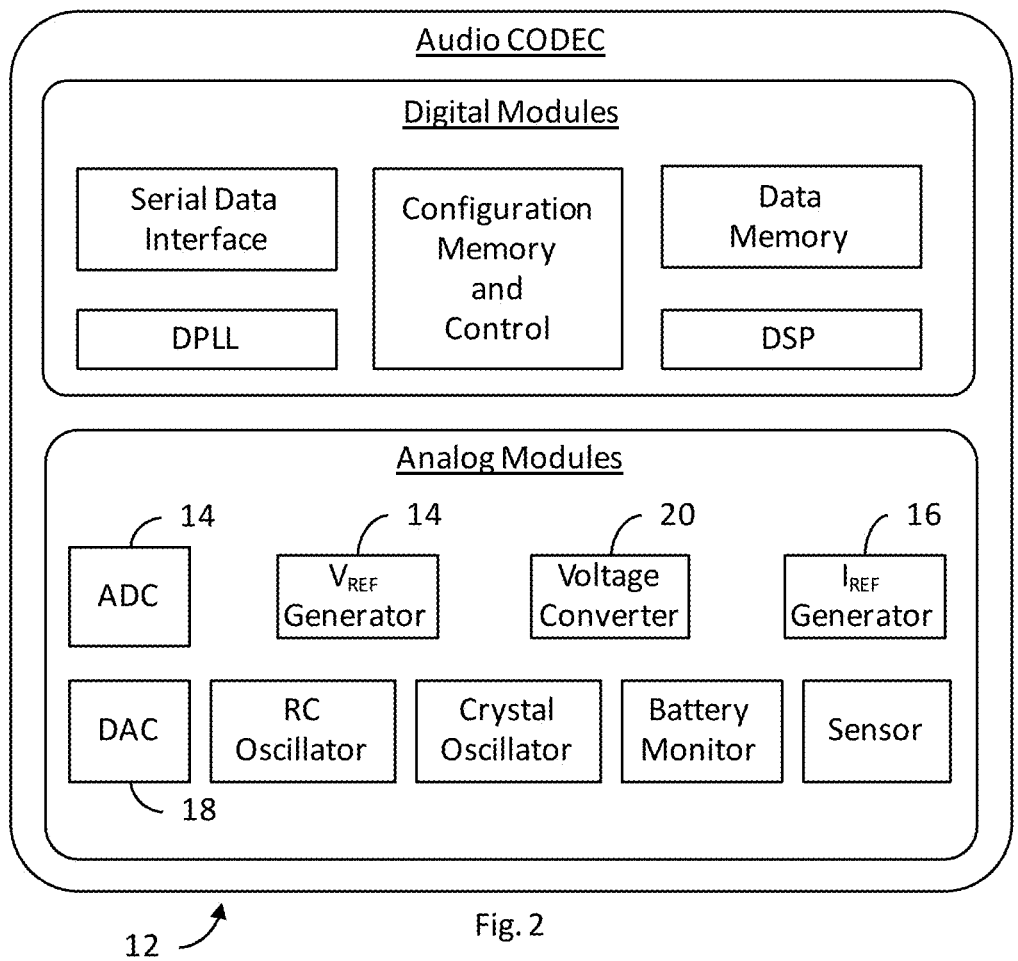
FIG. 2 illustrates, in block diagram form, a typical integrated system adapted to practice my invention.

In the drawings, similar elements will be similarly numbered whenever possible. However, this practice is simply for convenience of reference and to avoid unnecessary proliferation of numbers, and is not intended to imply or suggest that my invention requires identity in either function or structure in the several embodiments.

DETAILED DESCRIPTION OF THE INVENTION

Figure 3:
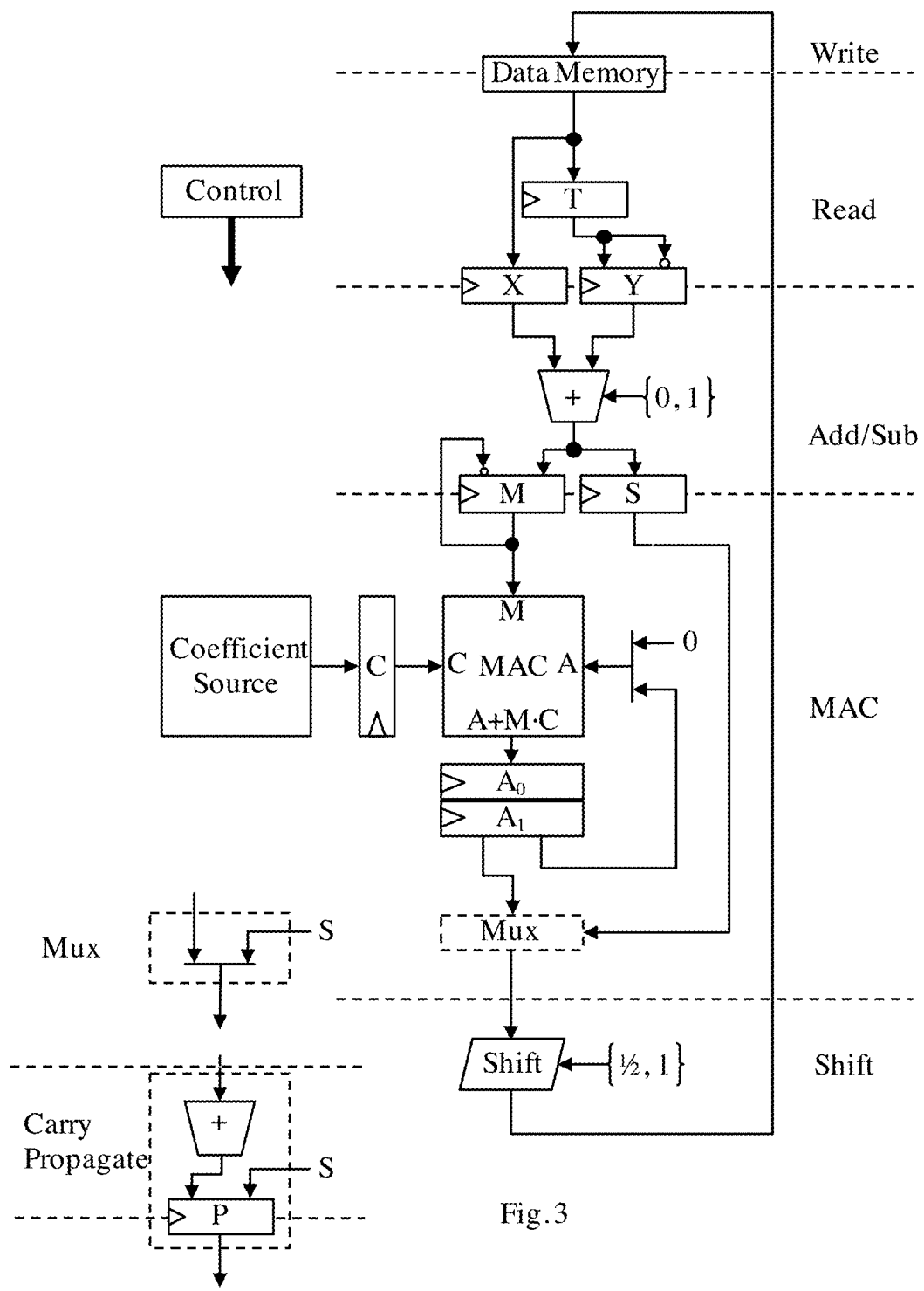
FIG. 3 illustrates, in block diagram form, one embodiment of an arithmetic unit adapted to performing a DIF butterfly in accordance with my invention.

FIG. 3 illustrates a preferred embodiment of an arithmetic unit ("AU") adapted to practice my invention, requiring only a single data memory read port, a single data memory write port, and which is capable of completing a DIF butterfly operation every 4 cycles. In general, my AU operates in response to signals developed in a predetermined sequence by a Control. As will be familiar to those skilled in this art, Control may comprise a general- or special-function controller, programmable using either software or firmware, or a hard-wired sequencer. Although the flow of control will be described hereinafter in terms of the functions performed and the results achieved, the specific control signals developed by Control will not be described in detail; further, the several control signals are not illustrated in FIG. 3 so as not to obscure the data flow paths.

In a read phase of operation, data read from the Data Memory may be loaded into register T or register X. The contents of register T may be loaded inverted or non-inverted into register Y.

In an add/subtract phase of operation, the contents of X and Y may be added together with a logic_1 or logic_0 carry-in, and the resulting sum or difference loaded into the M or S registers. If Y has been inverted, a difference is calculated. A carry-in of logic_1 may be used for calculating a 2's-complement difference, or for calculating a sum with rounding.

In a MAC phase of operation, a MAC facility multiplies the contents of the M register by a twiddle factor that has been selectively loaded into the C register from a Coefficient Source. As will be familiar to those skilled in this art, the Coefficient Source may include one or more of ROM, RAM, and logic gates. The product of the multiplier is added to zero, or to a value from one of two accumulator registers, A0 and A1. The sum is then loaded into A0 or A1. The M register may be loaded with an inverted copy of it's contents. This allows the negative product of C*M to be calculated. This is useful because the product of two imaginary numbers results in the negative of the product, so this avoids the need for storing a negative twiddle factor in the Coefficient Source. Preferably, the multiply and add operations may be combined to comprise a single MAC operation, completed in a single cycle.

In general, the two basic calculations performed in the MAC facility are:

$$A0=(Wr*Mi)+(Wi*Mr) \quad \text{[Eq. 5]}$$

$$A1=(Wr*Mr)-(Wi*Mi) \quad \text{[Eq. 6]}$$

As is known, the MAC facility can perform either a multiply or a multiply/accumulate. The multiply performs:

$$A=W*M \quad \text{[Eq. 7]}$$

and the multiply/accumulate performs:

$$A=A+(W*M) \quad \text{[Eq. 8]}$$

So one of the two multiplies in each equation is performed first, then the other multiply is performed and the result added to the A register. So for the A0 calculation of [Eq. 5], you can sequentially do either of these combinations:

$$A0=Wr*Mi; \quad \text{[Eq. 9]}$$

$$A0=A0+(Wi*Mr); \quad \text{[Eq. 10]}$$

or:

$$A0=Wi*Mr; \quad \text{[Eq. 11]}$$

$$A0=A0+(Wr*Mi); \quad \text{[Eq. 12]}$$

Whether you do [Eq. 9] followed by [Eq. 10], or [Eq. 11] followed by [Eq. 12], the result, A0, will be the same—but [Eq. 10] must be performed after [Eq. 9], and [Eq. 12] must be performed after [Eq. 11]. Likewise, for the A1 calculation, you can independently select either of these combinations:

$$A1=-(Wi*Mi); \quad \text{[Eq. 13]}$$

$$A1=A1+(Wr*Mr); \quad \text{[Eq. 14]}$$

or:

$$A1=Wr*Mr;\quad\text{[Eq. 15]}$$

$$A1=A1-(Wi*Mi);\quad\text{[Eq. 16]}$$

If you select [Eq. 9] and [Eq. 10] for performing the A0 calculation, you can still perform the A1 calculation using either [Eq. 13] and [Eq. 14], or [Eq. 15] and [Eq. 16]. Accordingly, all the possible combinations (not orderings) of these operations that will give the correct result are:
  (1) [Eq. 9], [Eq. 10], [Eq. 13], [Eq. 14]
  (2) [Eq. 9], [Eq. 10], [Eq. 15], [Eq. 16]
  (3) [Eq. 11], [Eq. 12], [Eq. 13], [Eq. 14]
  (4) [Eq. 11], [Eq. 12], [Eq. 15], [Eq. 16]
Further, within each of these four distinct combinations, the order of operations can be varied as long as each odd numbered step is performed sometime before the +1 even numbered step. For example, the combination (1), above, may validly be reordered as:
  (1') [Eq. 13], [Eq. 14], [Eq. 9], [Eq. 10]
or as:
  (1'') [Eq. 13], [Eq. 9], [Eq. 14], [Eq. 10].
Taking into consideration these constraints, the following 24 sequences of these operations all deliver valid results in accordance with [Eq. 5] and [Eq. 6]:
  (1.1) [Eq. 9], [Eq. 10], [Eq. 13], [Eq. 14];
  (1.2) [Eq. 9], [Eq. 13], [Eq. 10], [Eq. 14];
  (1.3) [Eq. 9], [Eq. 13], [Eq. 14], [Eq. 10];
  (1.4) [Eq. 13], [Eq. 14], [Eq. 9], [Eq. 10];
  (1.5) [Eq. 13], [Eq. 9], [Eq. 14], [Eq. 10];
  (1.6) [Eq. 13], [Eq. 9], [Eq. 10], [Eq. 14];
  (2.1) [Eq. 9], [Eq. 10], [Eq. 15], [Eq. 16];
  (2.2) [Eq. 9], [Eq. 15], [Eq. 10], [Eq. 16];
  (2.3) [Eq. 9], [Eq. 15], [Eq. 16], [Eq. 10];
  (2.4) [Eq. 15], [Eq. 16], [Eq. 9], [Eq. 10];
  (2.5) [Eq. 15], [Eq. 9], [Eq. 16], [Eq. 10];
  (2.6) [Eq. 15], [Eq. 9], [Eq. 10], [Eq. 16];
  (3.1) [Eq. 11], [Eq. 12], [Eq. 13], [Eq. 14];
  (3.2) [Eq. 11], [Eq. 13], [Eq. 12], [Eq. 14];
  (3.3) [Eq. 11], [Eq. 13], [Eq. 14], [Eq. 12];
  (3.4) [Eq. 13], [Eq. 14], [Eq. 11], [Eq. 12];
  (3.5) [Eq. 13], [Eq. 11], [Eq. 14], [Eq. 12];
  (3.6) [Eq. 13], [Eq. 11], [Eq. 12], [Eq. 14];
  (4.1) [Eq. 11], [Eq. 12], [Eq. 15], [Eq. 16];
  (4.2) [Eq. 11], [Eq. 15], [Eq. 12], [Eq. 16];
  (4.3) [Eq. 11], [Eq. 15], [Eq. 16], [Eq. 12];
  (4.4) [Eq. 15], [Eq. 16], [Eq. 11], [Eq. 12];
  (4.5) [Eq. 15], [Eq. 11], [Eq. 16], [Eq. 12]; and
  (4.6) [Eq. 15], [Eq. 11], [Eq. 12], [Eq. 16].

In one embodiment, illustrated in FIG. 3 to the left of the main flow path, the MAC facility may be adapted to produce results directly in carry-propagated format. In this embodiment, a mux can be configured to select the results stored in the A0 or A1 registers, or, in some cases, the contents of the S register.

In one other embodiment, also illustrated in FIG. 3 to the left of the main flow path, the MAC facility may be adapted to produce data in carry-save format. In this embodiment, the carry-save bits and the sum bits may be stored in a selected one of the A0 and A1 registers. Each of the A0 and A1 registers may store both the carry-save bits and the sum bits, with two register bits available for at least some bit positions. In one embodiment, some lower-order bits are in carry-propagated format and the higher-order bits are in carry-save format. The carry-save bits may then be added to the sum bits in an optional Carry Propagate unit, and the carry-propagated result saved in a pipeline register P. In some cases, the S register may be selectively loaded into the pipeline register P.

In a shift phase of operation, data from a selected one of the A0, A1 or S registers may be multiplied by powers of 2, such as ½, 1, or 2, via a shifter. In one embodiment, the shifter may comprise a bit selector adapted to select a predetermined range of the bits received from the selected source register.

In a write phase of operation, the transformed data developed by the shifter is coupled to the write port of the Data Memory and written in the Data Memory. In one embodiment, the write data and address are sent during the cycle before the write operation. In one other embodiment, the data/address may be delivered even earlier if a write buffer is provided.

Other datapath connections or shift factors may be implemented in the preferred embodiment to support other functions, but only those used to realize the DIF FFT butterfly are shown in FIG. 3.

Scaling of the transformed data may be realized by selecting a scaling factor of ½ or 1 for the shifter. Optimally, the data should be scaled by ½ only when it is essential to prevent overflow in the transformed data. This allows the maximum number of significant bits to be used in each data sample, thus maintaining the maximum precision in the result. One way of determining the selection of the ½ or 1 shift factor is to record whether any transformed sample in a particular butterfly level has an absolute value at or above a predetermined threshold, and if not, to scale by 1 in the next butterfly level, otherwise scaling by ½. The predetermined threshold may be a power of two. Other logic may limit the total number of butterfly levels that the data is scaled by 1 during the entire FFT calculation, in order to achieve a predetermined total scaling for the FFT.

Another preferred embodiment of the invention performs the several phases of operation in pipelined fashion, wherein each line represents a single pipeline cycle and each column represents the actions of a particular phase of operation of the apparatus illustrated in FIG. 3. As will be familiar to those skilled in this art, all actions on the same line happen simultaneously; so for example, the value of M used on the same line that has an assignment to M will be the old value assigned to M in an earlier cycle. A variable with an "r" represents the real part of a complex number and a variable with an "i" represents the imaginary part:

| Read | Add/Subtract | MAC | Shift | Write |
|---|---|---|---|---|
| Y1i | | | | |
| Y0i | | | | |
| Y1r | Mi = Y0i − Y1i | | | |
| Y0r | Si = Y0i + Y1i | A0 = Wr * Mi | | |
| | Mr = Y0r − Y1r | A1 = −Wi * Mi | | |
| | Sr = Y0r + Y1r | A0 = A0 + (Wi * Mr) | X0i = ½ * Si | |
| | | A1 = A1 + (Wr * Mr) | X1i = ½ * A0 | X0i |
| | | | X0r = ½ * Sr | X1i |
| | | | X1r = ½ * A1 | X0r |
| | | | | X1r |

Because the operations are pipelined, the memory will be reading data for the next butterfly operation while the other phases are continuing with the current butterfly. In accordance with my method, each stage of the pipeline only needs four pipeline cycles to complete its actions for a particular butterfly operation. Accordingly, after all stages of the pipe are filled with the initial set of values, all pipe stages operate in parallel until the data stream has been processed, at which point the pipe stages will be drained until all remaining values have been written back into the Data Memory. The alignment of the write operations with respect to the read operations will allow them to avoid conflicting with each other if the real and imaginary parts of each data sample are in separate memory banks, so that data can be read from the real bank while data from a previous butterfly operation is being written to the imaginary bank, and vice versa. Alternatively, the data memory could be arranged in a single bank that is clocked at twice the rate of the other units, so that one memory cycle is used for reading and the other for writing. The transformed output data samples X0i, X1i, X0r, and X1r may then be written to the same memory addresses that the input data samples Y0i, Y1i, Y0r, and Y1r were read from, respectively.

In yet another embodiment, an additional pipeline stage may be added to the MAC phase to accommodate the optional carry propagate operation. This may, for example, allow the first stage to calculate a carry-save result while the second stage completes the calculation with a carry-propagate adder. In this embodiment, the order of the read and write operations is different so that the write operations will not conflict with the read operations if the real and imaginary parts are stored in different memory banks:

| Read | Add/Subtract | MAC | Prop | Shift | Write |
|---|---|---|---|---|---|
| Y1r | | | | | |
| Y0r | | | | | |
| Y1i | Mr = Y0r − Y1r | | | | |
| Y0i | Sr = Y0r + Y1r | A0 = Wi * Mr | | | |
| | Mi = Y0i − Y1i | A1 = Wr * Mr | | | |
| | Si = Y0i + Y1i | A0 = A0 + (Wr * Mi) | Psr = Sr | | |
| | | A1 = A1 − (Wi * Mi) | Psi = Si | X0r = ½ * Psr | |
| | | | Pa0 = A0 | X0i = ½ * Psi | X0r |
| | | | Pa1 = A1 | X1i = ½ * Pa0 | X0i |
| | | | | X1r = ½ * Pa1 | X1i |
| | | | | | X1r |

In the Prop stage, data from the S register is loaded into the P register, or carry-save data from the MAC facility is summed and the result stored in the P register. During the following cycle the contents of the P register are shifted and sent to the memory to be written.

Although I have described my invention in the context of particular embodiments, one of ordinary skill in this art will readily realize that many modifications may be made in such embodiments to adapt either to specific implementations. Thus it is apparent that I have provided a method for performing a DIF butterfly that is both effective and efficient. Further, I submit that my method and apparatus provide performance generally superior to the best prior art techniques.

What I claim is:

1. A decimation in frequency FFT butterfly processor comprising:
    a data memory, having at least one read port and at least one write port, adapted to store a write data;
    a first register, operably coupled to the read port, adapted to store first data received from the read port;
    a second register, operably coupled to the read port, adapted to store second data received from the read port;
    a third register, operably coupled to the first register, adapted to store a fourth data comprising a selected one of the first data and inverted first data received from the first register;
    an adder, operably coupled to the second and third registers, adapted to add the second data and the fourth data to produce a fifth data comprising a selected one of a sum and a difference;
    a fourth register, operably coupled to the adder, adapted to store the fifth data received from the adder;
    a fifth register, operably coupled to a coefficient source, adapted to store a coefficient received from a coefficient source;
    a first accumulator register;
    a second accumulator register;
    a multiplier/accumulator unit, operably coupled to the fourth and fifth registers and to the first and second accumulator registers, adapted to:
        produce a product of the fifth data received from the fourth register and the coefficient received from the fifth register;
        add the product and a sum stored in a selected one of the first and the second accumulator register; and
        store the sum in a selected one of the first and second accumulator registers;
    a sixth register, operably coupled to the adder, adapted to store a sixth data comprising a selected one of the sum and difference received from the adder; and
    a multiplexer, operably coupled to the sixth register, the first and second accumulator registers and to the write port of the data memory, adapted to select as the write data a selected one of the sixth data stored in the sixth register and the sum stored in a selected one of the first or second accumulator registers, and to provide the selected write data to the write port of the data memory.

2. The decimation in frequency FFT butterfly processor of claim 1, wherein the fourth register is operably coupled to receive the inversion of the fourth register in anticipation of the multiplier/accumulator unit calculating a negative product of the fourth and fifth registers.

3. The decimation in frequency FFT butterfly processor of claim 1:
    wherein the multiplier/accumulator unit is further characterized as producing the product and the sum in a carry-save format, and the first and second accumulator registers are further characterized as storing the sum received from the adder in the carry-save format, wherein at least one bit position is saved as a sum bit and a carry bit; and
    wherein the multiplexer is further characterized as comprising a carry propagate adder adapted to produce as the write data a propagated sum from the sum and carry bits stored in a selected one of the first and second accumulator registers.

4. The decimation in frequency FFT butterfly processor of claim 1, further comprising:

a shifter, operably coupled between the multiplexer and the write port of the data memory, adapted to select as the write data at least a subset of the multiplexer bits to be written to the data memory.

5. The decimation in frequency FFT butterfly processor of claim 4, wherein the shifter is further characterized as providing to the write port of the data memory the write data selected by the multiplexer multiplied by a selected one of ½ and 1.

\* \* \* \* \*